United States Patent
Huang et al.

(10) Patent No.: US 7,438,844 B2
(45) Date of Patent: Oct. 21, 2008

(54) THERMAL INTERFACE MATERIAL AND METHOD FOR MANUFACTURING SAME

(75) Inventors: Hua Huang, Beijing (CN); Yang Wu, Beijing (CN); Chang-Hong Liu, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 9 days.

(21) Appl. No.: 11/321,278

(22) Filed: Dec. 29, 2005

(65) Prior Publication Data
US 2008/0081176 A1  Apr. 3, 2008

(30) Foreign Application Priority Data
Mar. 24, 2005  (CN) .................. 2005 1 0033841

(51) Int. Cl.
B29C 67/24 (2006.01)
(52) U.S. Cl. .................. 264/261; 165/185; 361/704
(58) Field of Classification Search .................. 264/261, 264/29.1; 361/704; 165/185
See application file for complete search history.

(56) References Cited

U.S. PATENT DOCUMENTS

| | | | |
|---|---|---|---|
| 6,350,488 B1 | 2/2002 | Lee et al. | |
| 6,407,922 B1 | 6/2002 | Eckblad et al. | |
| 6,891,724 B2 * | 5/2005 | De Lorenzo et al. | 361/704 |
| 6,913,075 B1 * | 7/2005 | Knowles et al. | 165/185 |
| 6,924,335 B2 * | 8/2005 | Fan et al. | 524/495 |
| 6,965,513 B2 * | 11/2005 | Montgomery et al. | 361/687 |
| 7,086,451 B2 * | 8/2006 | Leu et al. | 165/80.3 |
| 7,132,161 B2 * | 11/2006 | Knowles et al. | 428/364 |
| 2003/0111333 A1 | 6/2003 | Montgomery et al. | |
| 2004/0097635 A1 * | 5/2004 | Fan et al. | 524/496 |
| 2005/0061496 A1 * | 3/2005 | Matabayas | 165/185 |
| 2005/0092464 A1 * | 5/2005 | Leu et al. | 165/80.3 |
| 2005/0168941 A1 * | 8/2005 | Sokol et al. | 361/688 |
| 2005/0180113 A1 * | 8/2005 | Shirakami et al. | 361/704 |
| 2005/0224220 A1 * | 10/2005 | Li et al. | 165/185 |
| 2006/0187641 A1 * | 8/2006 | Shin | 361/704 |

FOREIGN PATENT DOCUMENTS

CN  1501483 A  6/2004

* cited by examiner

Primary Examiner—Mary Lynn Theisen
(74) Attorney, Agent, or Firm—D. Austin Bonderer

(57) ABSTRACT

A thermal interface material includes a macromolecular material having two opposite Surfaces, and a plurality of carbon nanotubes each having two opposite ends embedded in the macromolecular material. The two opposite ends of the carbon nanotubes extend out of the two opposite surfaces of the macromolecular material respectively. A method for manufacturing the thermal interface material is also provided.

13 Claims, 5 Drawing Sheets

THERMAL INTERFACE MATERIAL AND METHOD FOR MANUFACTURING SAME

CROSS-REFERENCE TO RELATED APPLICATIONS

This application is related to three corresponding U.S. patent applications each entitled "THERMAL INTERFACE MATERIAL AND METHOD FOR MANUFACTURING SAME" with application Ser. No. 11/024,513, filed on Dec. 28, 2004, "METHOD FOR MANUFACTURING CARBON NANOTUBES WITH UNIFORM LENGTH" with application Ser. No. 11/025,160, filed on Dec. 28, 2004, "THERMAL INTERFACE MATERIAL AND METHOD FOR MANUFACTURING SAME" with application Ser. No. 11/089,864, filed on Mar. 25, 2005, and "THERMAL INTERFACE MATERIAL AND METHOD FOR MAKING SAME", filed recently, each having the same assignee as the instant application. The disclosures of the above-identified applications are incorporated herein by reference.

TECHNICAL FIELD

The present invention relates to thermal interface materials and manufacturing methods thereof, and more particularly to a thermal interface material which conducts heat by using carbon nanotubes, and a manufacturing method thereof.

BACKGROUND

Electronic components such as semiconductor chips are becoming progressively smaller, while at the same time heat dissipation requirements thereof are increasing. Commonly, a thermal interface material is utilized between the electronic component and a heat sink in order to efficiently dissipate heat generated by the electronic component.

A conventional thermal interface material is made by diffusing particles with a high heat conduction coefficient in a base material. The particles can be made of graphite, boron nitride, silicon oxide, alumina, silver, or other metals. However, a heat conduction coefficient of the thermal interface material is now considered to be too low for many contemporary applications, because it cannot adequately meet the heat dissipation requirements of modern electronic components.

An article entitled "Unusually High Thermal Conductivity of Carbon Nanotubes" and authored by Savas Berber (page 4613, Vol. 84, Physical Review Letters 2000) discloses that a heat conduction coefficient of a carbon nanotube can be 6600W/m·K (watts/meter·Kelvin) at room temperature.

A kind of thermal interface material which conducts heat by using carbon nanotubes has been developed. The thermal interface material is formed by injection molding, and has a plurality of carbon nanotubes incorporated in a matrix material. A first surface of the thermal interface material engages with an electronic device, and a second surface of the thermal interface material engages with a heat sink. The second surface has a larger area than the first surface, so that heat can be uniformly spread over the larger second surface. But the thermal interface material formed by injection molding is relatively thick. This increases a bulk of the thermal interface material and reduces its flexibility. Furthermore, the carbon nanotubes are disposed in the matrix material randomly and multidirectionally. This means that heat does not necessarily spread uniformly through the thermal interface material. In addition, the heat does not necessarily spread directly from the first surface engaged with the electronic device to the second surface engaged with the heat sink.

A method for producing aligned carbon nanotube thermal interface structure is provided. In a batch process, a capacitor is immersed in a bath containing a slurry of thermoplastic polymer containing randomly oriented carbon nanotubes and energized to create an electrical field to orient the carbon nanotubes prior to curing.

However, the enhanced value for the thermal interface structure's thermal conductivity is still not satisfactory. An important reason is probably rest with the existence of thermal interface resistances between the overlaps in the carbon nanotube passage of the thermal interface structure, and this would lead to a rapid increase in the overall thermal resistance.

Therefore, a thermal interface material with good thermal conductivity and a method for manufacturing such a material are desired.

SUMMARY

A thermal interface material includes a macromolecular material having two opposite surfaces and a plurality of carbon nanotubes each having two opposite ends embedded in the macromolecular material. The two opposite ends extending out of the two opposite surfaces of the macromolecular material respectively.

A method for manufacturing a thermal interface material includes the steps of: providing a plurality of carbon nanotubes each having two opposite ends; forming protective layers on the both ends of the carbon nanotubes; filling clearances among the carbon nanotubes having protective layers on the both ends with a macromolecular material; and removing the protective layers from the carbon nanotubes.

Other advantages and novel features will become more apparent from the following detailed description when taken in conjunction with the accompanying drawings, in which:

DETAILED DESCRIPTION OF THE EMBODIMENTS

The present invention is further described below and by reference to the figures.

Figure 1:
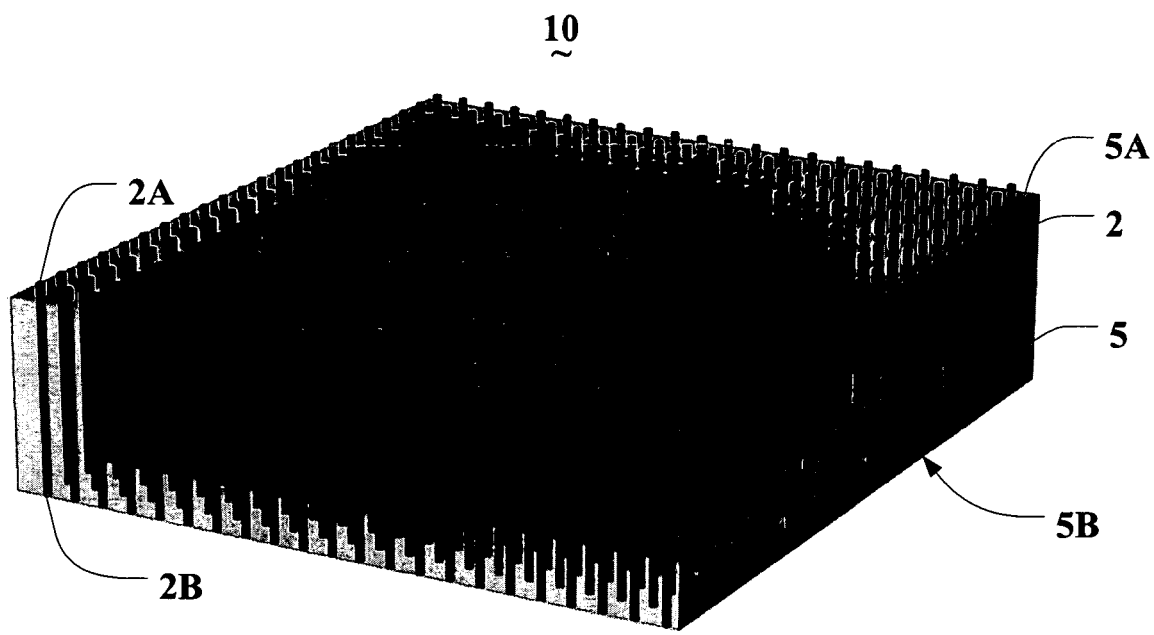
FIG. 1 is a schematic view showing a tridimensional configuration of a thermal interface material in accordance with an embodiment the present invention.

Referring to FIG. 1, a thermal interface material 10 includes a macromolecular material 5 comprises a first surface 5A and an opposite second surface 5B and a plurality of carbon nanotubes 2 each having a first end 2A and an opposite second end 2B embedded in the macromolecular material 5.

The first end 2A and the second end 2B extending out of the opposite surfaces 5A and 5B of the macromolecular material 5 respectively.

The macromolecular material 5 may be selected from the group comprising of silica gel, polyethylene glycol, polyester, epoxy resin, and an acrylic. Preferably, the carbon nanotubes 2 are substantially parallel to each other and perpendicular to the first surface 5A and the second surface 5B of the macromolecular material 5.

Figure 2:
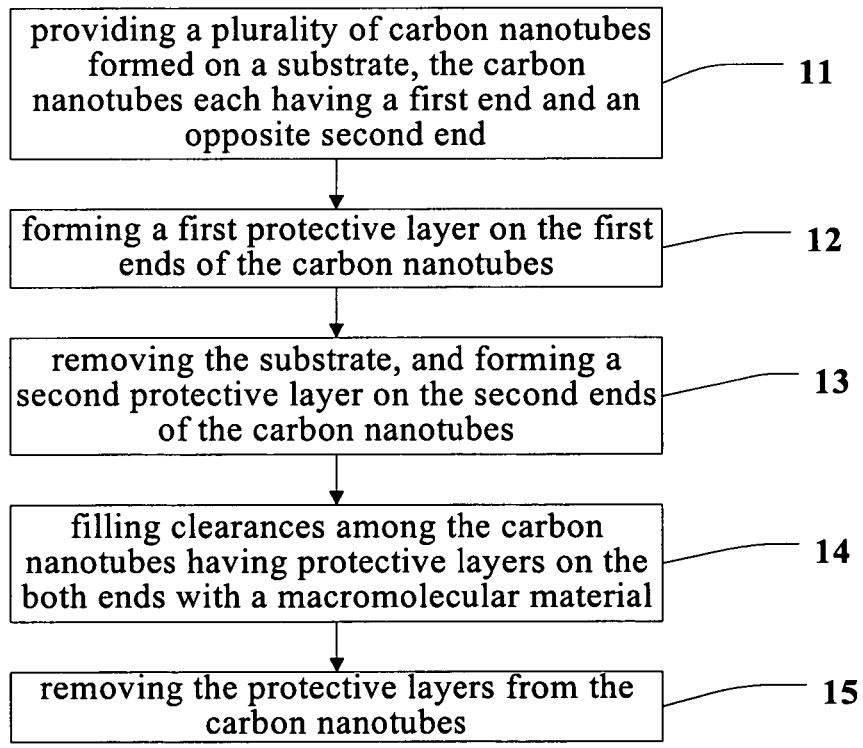
FIG. 2 is a schematic flow chart for manufacturing the thermal interface material of FIG. 1.
Figure 3:
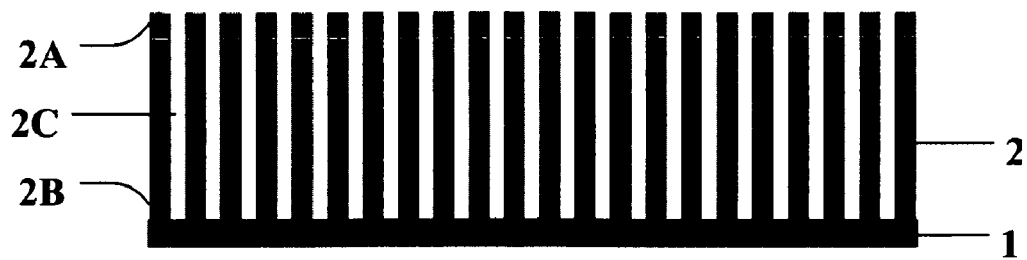
FIG. 3 to FIG.7 are schematic views for illustrating the manufacturing steps 11~15 in FIG. 2.
Figure 4:
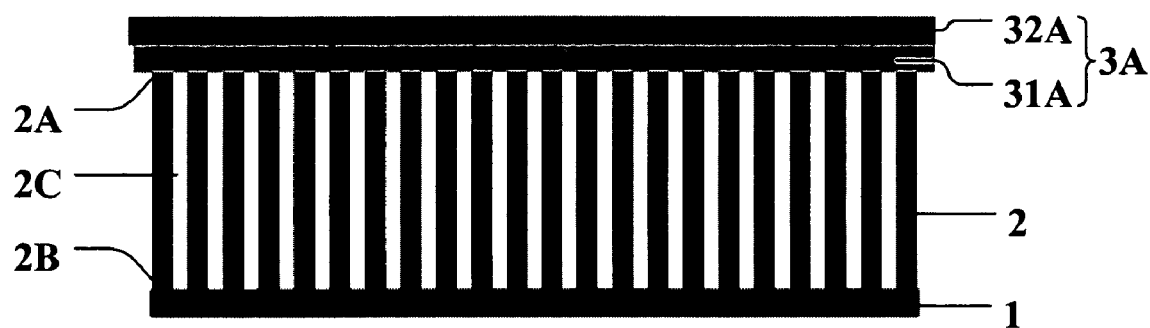
Figure 5:
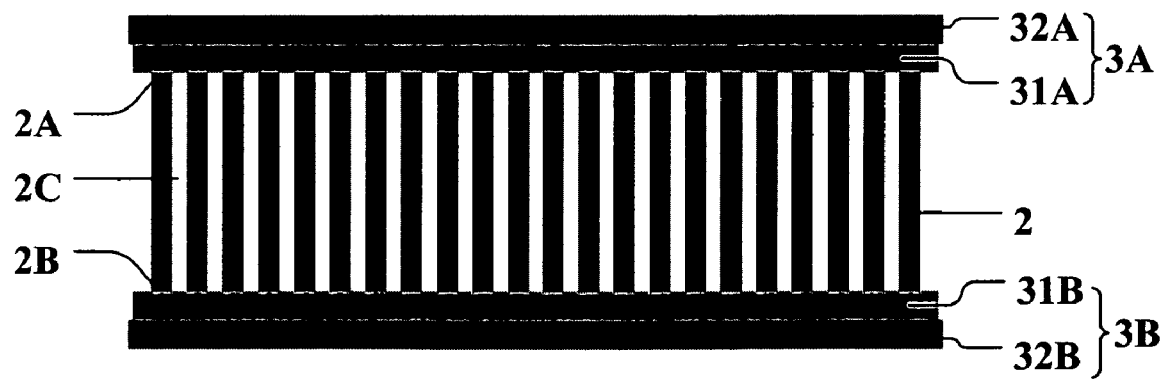
Figure 6:
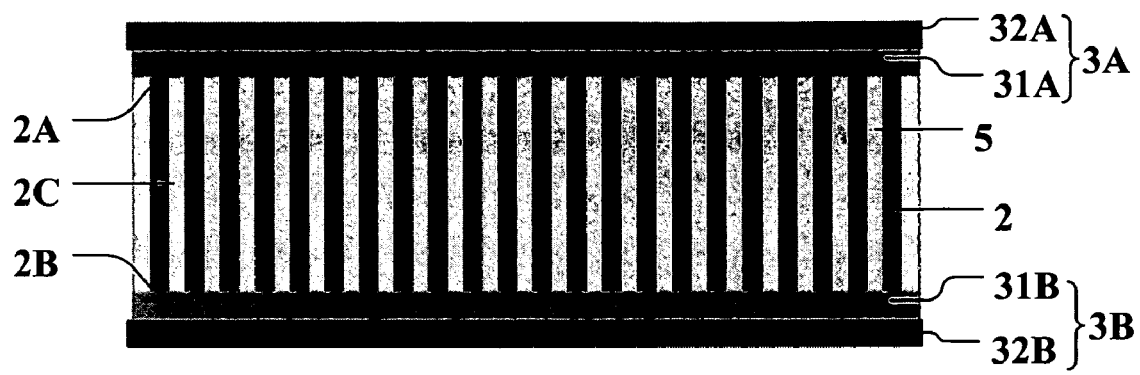
Figure 7:
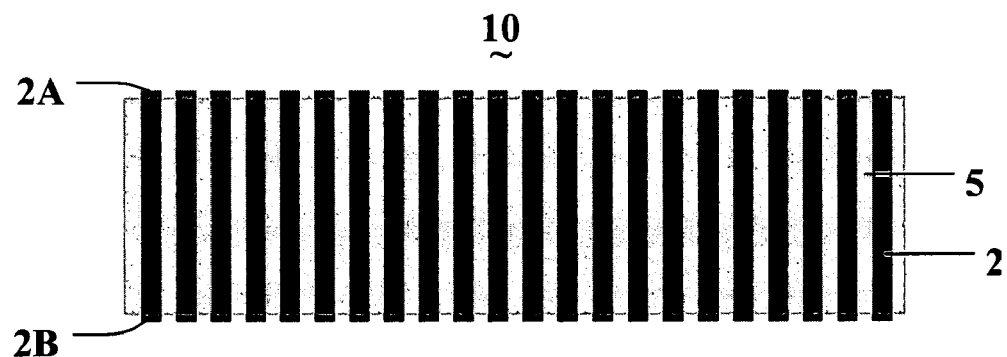

Referring to FIG. 2, a method for making the thermal interface material 10 is provided. The method can be an in-situ injection molding, which comprises the steps of:

Step 11, providing a plurality of carbon nanotubes formed on a substrate, the carbon nanotubes each having a first end and an opposite second end;

Step 12, forming a first protective layer on the first ends of the carbon nanotubes;

Step 13, removing the substrate, and forming a second protective layer on the second ends of the carbon nanotubes;

Step 14, filling clearances among the carbon nanotubes having protective layers on the both ends with a macromolecular material; and Step 15, removing the protective layers from the carbon nanotubes.

Referring to FIG. 3 to FIG. 11, the method for making the thermal interface material 10 in accordance with the present invention is detail described below and by reference to embodiments.

Figure 8:
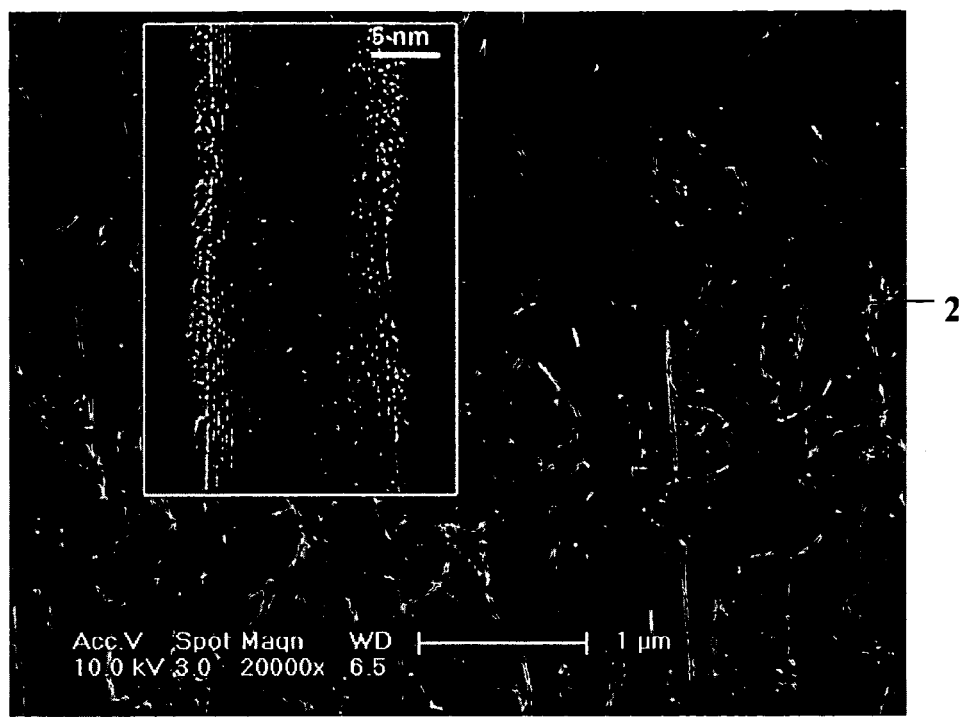
FIG. 8 is a Scanning Electron Microscope (SEM) image of a side view of a carbon nanotubes for manufacturing the thermal interface material of FIG. 1.

Step 11, providing a plurality of carbon nanotubes 2 on a substrate 1, the carbon nanotubes 2 each having a first end 2A and an opposite second end 2B. The substrate 1 is made from a material selected from the group comprising of glass, silicon, metal, and a metal oxide. The carbon nanotubes 2 is formed by one of a chemical vapor deposition method, a deposition method and a printing method. In the preferred embodiment, a chemical vapor deposition method is used. Firstly, forming a catalyst (not shown) on the substrate 1, and then the carbon nanotubes 2 are formed on the catalyst by providing a carbon source gas at high temperature. The catalyst can be made from material selected from the group comprising iron (Fe), cobalt (Co), nickel (Ni), and an alloy thereof. The carbon source gas can be methane, ethylene, propylene, acetylene, methanol or ethanol. In the preferred embodiment, the substrate 11 is made of silicon. An iron film having a thickness of 5 nm is coating on the substrate 11, and annealed in air at 300 degrees Celsius as the catalyst. Then the substrate 1 with the catalyst disposed thereon is placed in a chemical vapor deposition chamber (not shown), and a carbon source gas of ethylene is provided in the chemical vapor deposition chamber at a temperature of 700 degrees Celsius to grow the carbon nanotubes 2. The carbon nanotubes 2 are grown substantially perpendicularly on the substrate 1 having a highness of about 0.3 mm. A Scanning Electron Microscope (SEM) image of a side view of the carbon nanotubes 2 is shown as FIG. 8. The inset of FIG. 8 shows a High-Resolution Transmission Electron Microscopy (HRTEM) image of a single Multi-wall Nanotube (MWNT) with a diameter of about 12 nm.

Step 12, forming a first protective layer 3A on the first ends 2A of the carbon nanotubes 2. The first protective layer 3A is coated on the first ends 2A of the carbon nanotubes 2. The first protective layer 3A includes a pressure sensitive adhesive layer 31A and a polyester film 32A. In the preferred embodiment, the layer of pressure sensitive adhesive layer 31A having a thickness of 0.05 mm is coated on a side of the polyester film 32A. Put the polyester film 32A on first ends 2A of the carbon nanotubes 2, and cover the first ends 2A of the carbon nanotubes 2 with the pressure sensitive adhesive layer 31A by gently pressing the polyester film 32A, then a first protective layer 3A is formed. The pressure sensitive adhesive layer 31A is made from the YM881 type of pressure sensitive adhesive material, which is available from Light Industry Institute, Fushun, China.

Step 13, removing the substrate 1, and forming a second protective layer 3B on the second ends 2B of the carbon nanotubes 2. Taking off the substrate 1 from the second ends 2B of the carbon nanotubes 2, and forming a second protective layer 3B having a pressure sensitive adhesive layer 31B and a polyester film 32B on the second ends 2B of the carbon nanotubes 2 as step 12. Therefore, the carbon nanotubes 2 are formed like an injection mold with protective layers 3A and 3B coated on both the first ends 2A and the second ends 2B thereof.

Figure 9:
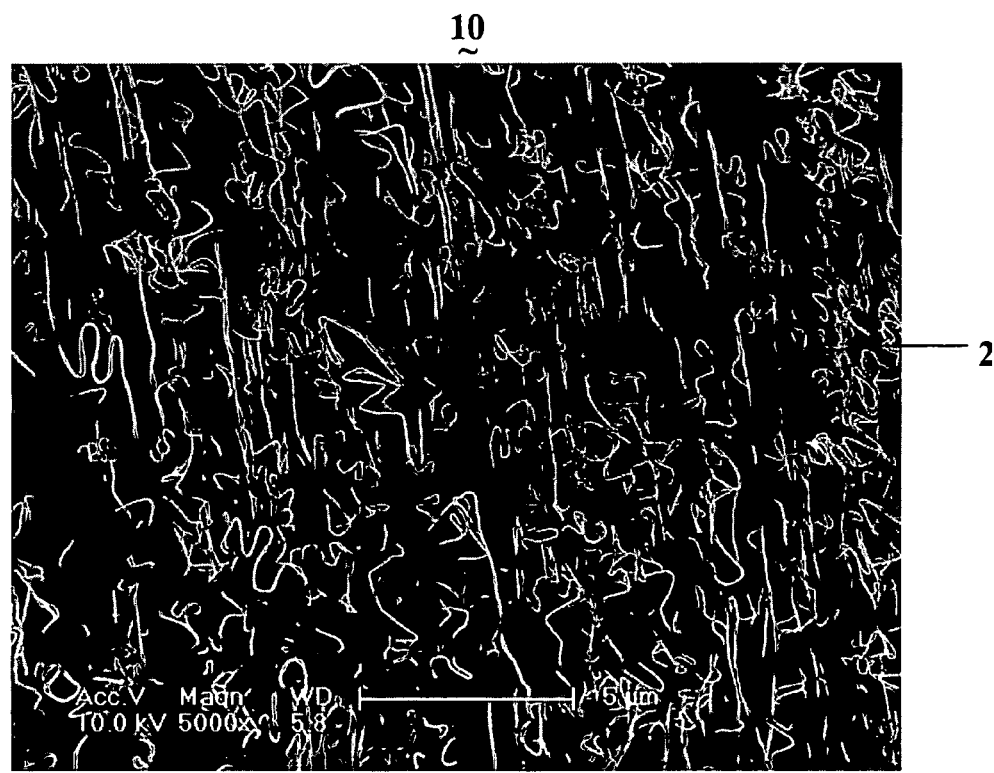
FIG. 9 is an SEM image of a side view of the thermal interface material of FIG. 1.
Figure 10:
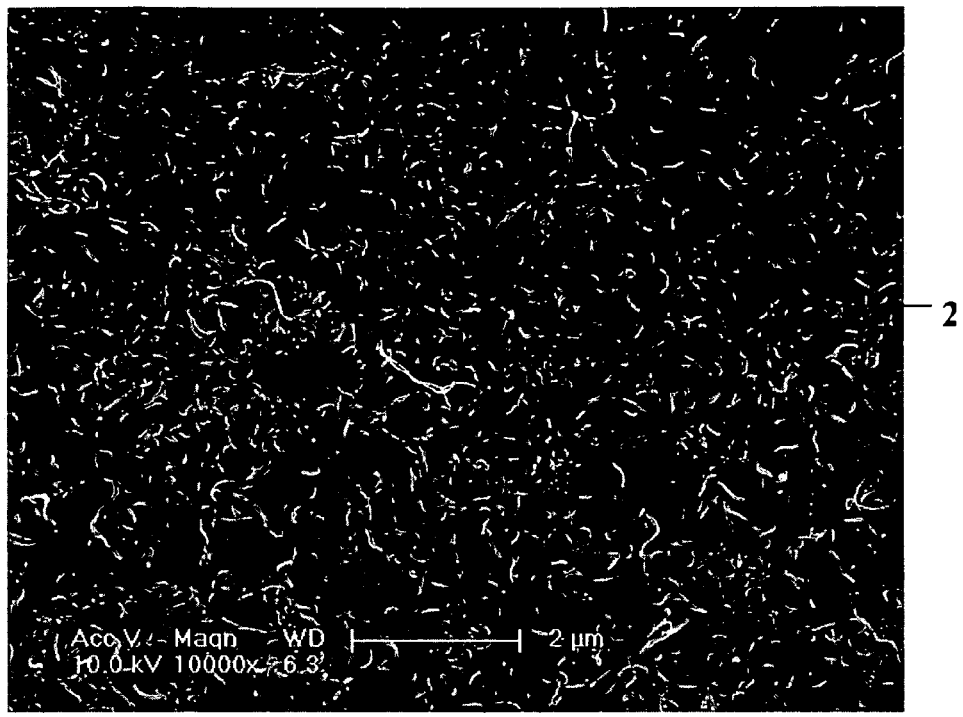
FIG. 10 is an SEM image of a top view of the thermal interface material of FIG. 1.

Step 14, filling clearances 2C among the carbon nanotubes 2 having protective layers 3A and 3B on the both ends 2A and 2B with a macromolecular material 5. The filling step is performed by immersing the carbon nanotubes 2 into a melt or solution of the macromolecular material 5. Curing the macromolecular material 5 filled in the clearances among the carbon nanotubes 2 in vacuum. The macromolecular material 5 is selected from the group comprising of silica gel, polyethylene glycol, polyester, epoxy resin, and an acrylic. In the preferred embodiment, the macromolecular material 5 is made from the Sylgard 160 type of two parts silicone elastomer material, which is available from Dow Coming. The Sylgard 160 is supplied as two-part liquid component kits comprised of Part A/Part B to be mixed in a 1:1 ratio by weight or volume. Immersing the carbon nanotubes 2 into a Sylgard 160 solution with Part A:Part B:ethyl acetate at a volume ratio of 1:1:1. And curing the Sylgard 160 filled in the clearances 2C of the carbon nanotubes 2 in a vacuum chamber at room temperature for 24 hours. An SEM image of a side view of the carbon nanotubes 2 with Sylgard 160 filled clearances 2C is shown as FIG. 9. As FIG. 9 shows, the configuration of the carbon nanotubes 2 does not been distorted.

Step 15, removing the protective layers 3A and 3B from the carbon nanotubes 2. Removal of the protective layers 3A and 3B can be easily achieved by stripping away the polyester films 32A and 32B and dissolving the remaining pressure sensitive adhesive layers 31A and 31B in selected organic solvent, thereby, a surface 5A and an opposite surface 5B of the macromolecular material 5 are formed. In the preferred embodiment, the organic solvent is xylene. An SEM image of a top view of the thermal interface material 10 is shown as FIG. 10, almost all carbon nanotubes 2 having ends protruding out of the two opposite surfaces 5A/5B of the macromolecular material 5.

Figure 11:
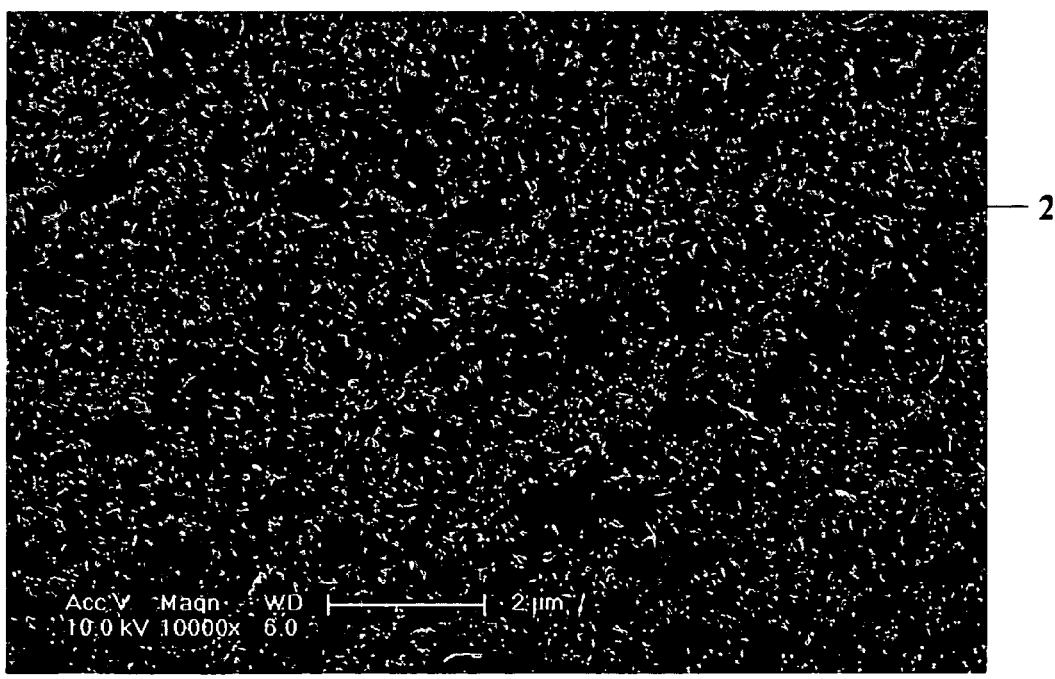
FIG. 11 is an SEM image of a top view of the thermal interface material of FIG. 1 after a reactive ion etching step.

Preferably, the method for making the thermal interface material 10 further comprises a reactive ion etching step. Further treatments can be conducted by reactive ion etching to ensure all carbon nanotube tips of the carbon nanotubes 2 revealed. In the preferred embodiment, the reactive ion etching processes are carried out using $O_2$ plasma at a pressure of 6 Pa and with a power of 150W for 15 min at each surface 5A/5B of the macromolecular material 5. FIG. 11 is an SEM image of a top view of the thermal interface material 10 after reactive ion etching treatments, showing all ends protruding out of the two corresponding surfaces 5A/5B of the macromolecular material 5.

Because two opposite ends of each carbon nanotubes of the thermal interface material are protruded out of the two opposite surfaces of the macromolecular material. Heat conduction paths formed by the carbon nanotubes contact the thermal contact surface directly, and the overall thermal resistance of the thermal interface material is reduced thereby.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A method for manufacturing a thermal interface material, comprising the steps of:
    providing a plurality of carbon nanotubes each having two opposite ends;
    forming two protective layers on the carbon nanotubes so that the ends of the carbon nanotubes are covered by the protective layers;
    filling clearances among the carbon nanotubes with a macromolecular material, after having formed the two protective layers on the carbon nanotubes; and
    removing the protective layers from the carbon nanotubes so that, after removing the protective layers, opposite end portions of the carbon nanotubes protrude from opposite sides of the macromolecular material.

2. The method for manufacturing a thermal interface material in accordance with claim 1, wherein in the providing step, the carbon nanotubes are formed on a substrate.

3. The method for manufacturing a thermal interface material in accordance with claim 2, wherein the substrate is made from a material selected from the group consisting of glass, silicon, metal, and a metal oxide.

4. The method for manufacturing a thermal interface material in accordance with claim 2, wherein the carbon nanotubes are formed by one of a chemical vapor deposition method, a deposition method, and a printing method.

5. The method for manufacturing a thermal interface material in accordance with claim 4, wherein a catalyst used in the chemical vapor deposition method is made from material selected from the group consisting of iron, cobalt, nickel, and an alloy thereof.

6. The method for manufacturing a thermal interface material in accordance with claim 4, wherein a carbon source gas used in the chemical vapor deposition method is selected from the group consisting of methane, ethylene, propylene, acetylene, methanol, and ethanol.

7. The method for manufacturing a thermal interface material in accordance with claim 1, wherein the protective layers comprise a pressure sensitive adhesive layer and a polyester film.

8. The method for manufacturing a thermal interface material in accordance with claim 1, wherein the macromolecular material is selected from the group consisting of silica gel, polyethylene glycol, polyester, epoxy resin, and an acrylic.

9. The method for manufacturing a thermal interface material in accordance with claim 1, wherein the filling step is performed by immersing the carbon nanotubes having the protective layers on the ends thereof into a melt or solution of the macromolecular material.

10. The method for manufacturing a thermal interface material in accordance with claim 9, further comprising the step of curing the macromolecular material filled in the clearances among the carbon nanotubes.

11. The method for manufacturing a thermal interface material in accordance with claim 1, further comprising the step of reactive ion etching the thermal interface material after the removing step.

12. The method for manufacturing a thermal interface material in accordance with claim 11, wherein the reactive ion etching is O2 plasma etching.

13. A method for manufacturing a thermal interface material, comprising the steps of:
    providing an array of carbon nanotubes formed on a substrate, the array of carbon nanotubes having two opposite ends;
    removing the substrate and forming two protective layers on the ends of the array of the carbon nanotubes;
    immersing the carbon nanotubes in a melted macromolecule material solution, after having formed the two protective layers on the ends of the array of the carbon nanotubes, and solidifying the macromolecule material; and
    removing the protective layers from the carbon nanotubes.

* * * * *